United States Patent
Ganta et al.

(10) Patent No.: US 10,581,453 B1
(45) Date of Patent: Mar. 3, 2020

(54) PRECISION CURRENT-TO-DIGITAL CONVERTER

(71) Applicant: Robert Bosch GmbH, Stuttgart (DE)

(72) Inventors: Saikrishna Ganta, Milpitas, CA (US); Man-Chia Chen, Palo Alto, CA (US); Chinwuba Ezekwe, Albany, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/223,178

(22) Filed: Dec. 18, 2018

(51) Int. Cl.
*H03M 3/00* (2006.01)

(52) U.S. Cl.
CPC ........... *H03M 3/454* (2013.01); *H03M 3/356* (2013.01); *H03M 3/43* (2013.01); *H03M 3/464* (2013.01)

(58) Field of Classification Search
CPC .............................. H03M 3/454; H03M 3/356
USPC .......................... 341/143, 118, 120, 144, 155
See application file for complete search history.

(56) References Cited

U.S. PATENT DOCUMENTS

| | | | |
|---|---|---|---|
| 6,369,730 B1 * | 4/2002 | Blanken | H03M 3/348 341/143 |
| 7,183,957 B1 | 2/2007 | Melanson | |
| 7,358,880 B1 | 4/2008 | Melanson | |
| 7,450,665 B2 | 11/2008 | Guimaraes | |
| 9,407,283 B2 | 8/2016 | Caldwell et al. | |
| 9,602,126 B2 * | 3/2017 | Schinkel | H03M 3/446 |
| 2006/0250853 A1 * | 11/2006 | Taylor | G11C 7/062 365/185.21 |
| 2008/0062022 A1 * | 3/2008 | Melanson | H03M 3/464 341/143 |
| 2012/0056661 A1 * | 3/2012 | Shabra | H03K 17/6871 327/436 |

* cited by examiner

*Primary Examiner* — Peguy Jean Pierre
(74) *Attorney, Agent, or Firm* — Maginot, Moore & Beck LLP (57) ABSTRACT

A current sensing system and delta sigma modulator architecture are discloses for sensing and digitizing a current input signal from a high impedance signal source with improve power efficiency. The delta sigma modulator integrates a signal condition stage within the delta sigma modulator feedback loop by utilizing a capacitive summation stage. For given gain, resolution, and bandwidth requirements, the delta sigma modulator architecture achieves reduced power consumption by advantageously reducing the number of nodes in the system that require a high dynamic range. Additionally, the delta sigma modulator has very high input impedance such that the input of the delta-sigma modulator can be connected directly to a high impedance signal source, without the need for a front-end pre-amplifier stage, or the like.

19 Claims, 7 Drawing Sheets

PRECISION CURRENT-TO-DIGITAL CONVERTER

FIELD

The device and method disclosed in this document relates to current sensing and, more particularly, to a current-to-digital converter.

BACKGROUND

Unless otherwise indicated herein, the materials described in this section are not prior art to the claims in this application and are not admitted to the prior art by inclusion in this section.

Current sensing circuits are widely used in many sensor applications to process an analog current signal and convert it to the digital domain. For current sensing applications that require high resolution and low bandwidth, a delta-sigma modulator (DSM) is often utilized to perform digitization for its superior power efficiency over other analog-to-digital converter (ADC) architectures. However, in many applications, such as sensing a current of a high impedance sensor, the current sensing circuit must have a high input impedance, so as to avoid drawing current and negatively affecting the performance of the sensor. Accordingly, when measuring a current from a high impedance sensor, conventional DSM-based current sensing circuits must utilize some kind of front-end signal-conditioning circuit, such as a pre-amp stage, to convert the high impedance sensor current signal to a low impedance output signal, so that it can be digitized.

Figure 1:
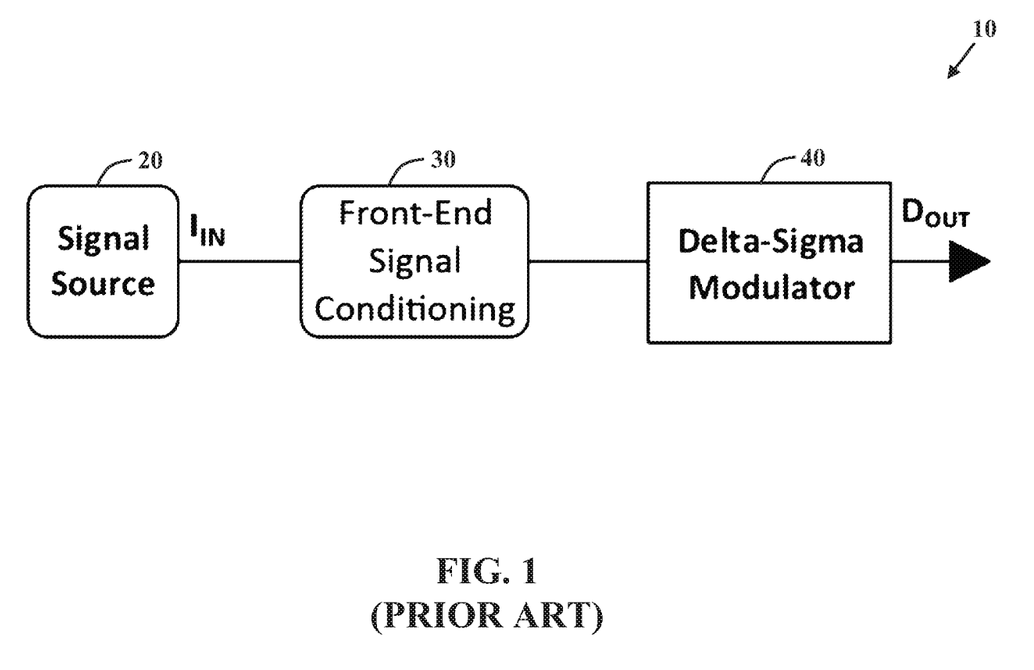
FIG. 1 shows a conventional DSM-based current sensing system for measuring and digitizing a current signal from a high impedance signal source.

FIG. 1 shows a conventional DSM-based current sensing system 10 for measuring and digitizing a current signal $I_{IN}$ from a high output impedance signal source 20. The current signal $I_{IN}$ is provided to a front-end signal-conditioning stage 30 before being digitized by a delta-sigma modulator 40 to provide a digital output signal $D_{OUT}$. However, as the required resolution becomes higher, the high dynamic range enforced at the input nodes of both the front-end signal-conditioning stage 30 and the delta-sigma modulator 40 nevertheless results in a relatively high power implementation. Accordingly, what is needed is a current sensing circuit that provides a high input impedance, a low power consumption, and a high dynamic range.

SUMMARY

A delta sigma modulator for sensing a current input signal of a current source is disclosed. The delta sigma modulator comprises: a first node configured to connect to the current source and receive the current input signal, the first node being an input of the delta sigma modulator; a capacitive summation circuit having an input connected to the first node and an output connected to a second node, the capacitive summation circuit being configured to amplify a signal at the first node and provide an amplified signal to the second node, the capacitive summation circuit comprising (i) a first amplifier having an input connected to the first node and an output connected to the second node and (ii) a first capacitance connected between the output of the first amplifier and the input of the first amplifier; a loop filter circuit having an input connected to the second node and an output connected to a third node, the loop filter being configured to filter the amplified signal at the second node and provide a filtered signal to the third node; a quantizer circuit having an input connected to the third node and an output connected to a fourth node, the fourth node being an output of the delta sigma modulator, the quantizer circuit being configured to quantize the filtered signal at the third node and provide a quantized signal to the fourth node; and a first feedback path connected between the fourth node and the first node, at least one second capacitance being arranged in the first feedback path and configured to capacitively couple the quantized signal to the first node.

A current sensing system is disclosed. The current sensing system comprises: a current source configured to provide a current input signal; and a delta sigma modulator. The delta sigma modulator comprises: a first node configured to connect to the current source and receive the current input signal, the first node being an input of the delta sigma modulator; a capacitive summation circuit having an input connected to the first node and an output connected to a second node, the capacitive summation circuit being configured to amplify a signal at the first node and provide an amplified signal to the second node, the capacitive summation circuit comprising (i) a first amplifier having an input connected to the first node and an output connected to the second node and (ii) a first capacitance connected between the output of the first amplifier and the input of the first amplifier; a loop filter circuit having an input connected to the second node and an output connected to a third node, the loop filter being configured to filter the amplified signal at the second node and provide a filtered signal to the third node; a quantizer circuit having an input connected to the third node and an output connected to a fourth node, the fourth node being an output of the delta sigma modulator, the quantizer circuit being configured to quantize the filtered signal at the third node and provide a quantized signal to the fourth node; and a first feedback path connected between the fourth node and the first node, at least one second capacitance being arranged in the first feedback path and configured to capacitively couple the quantized signal to the first node.

BRIEF DESCRIPTION OF THE DRAWINGS

The foregoing aspects and other features of the delta sigma modulator and current sensing system are explained in the following description, taken in connection with the accompanying drawings.

DETAILED DESCRIPTION

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art which this disclosure pertains.

Figure 2:
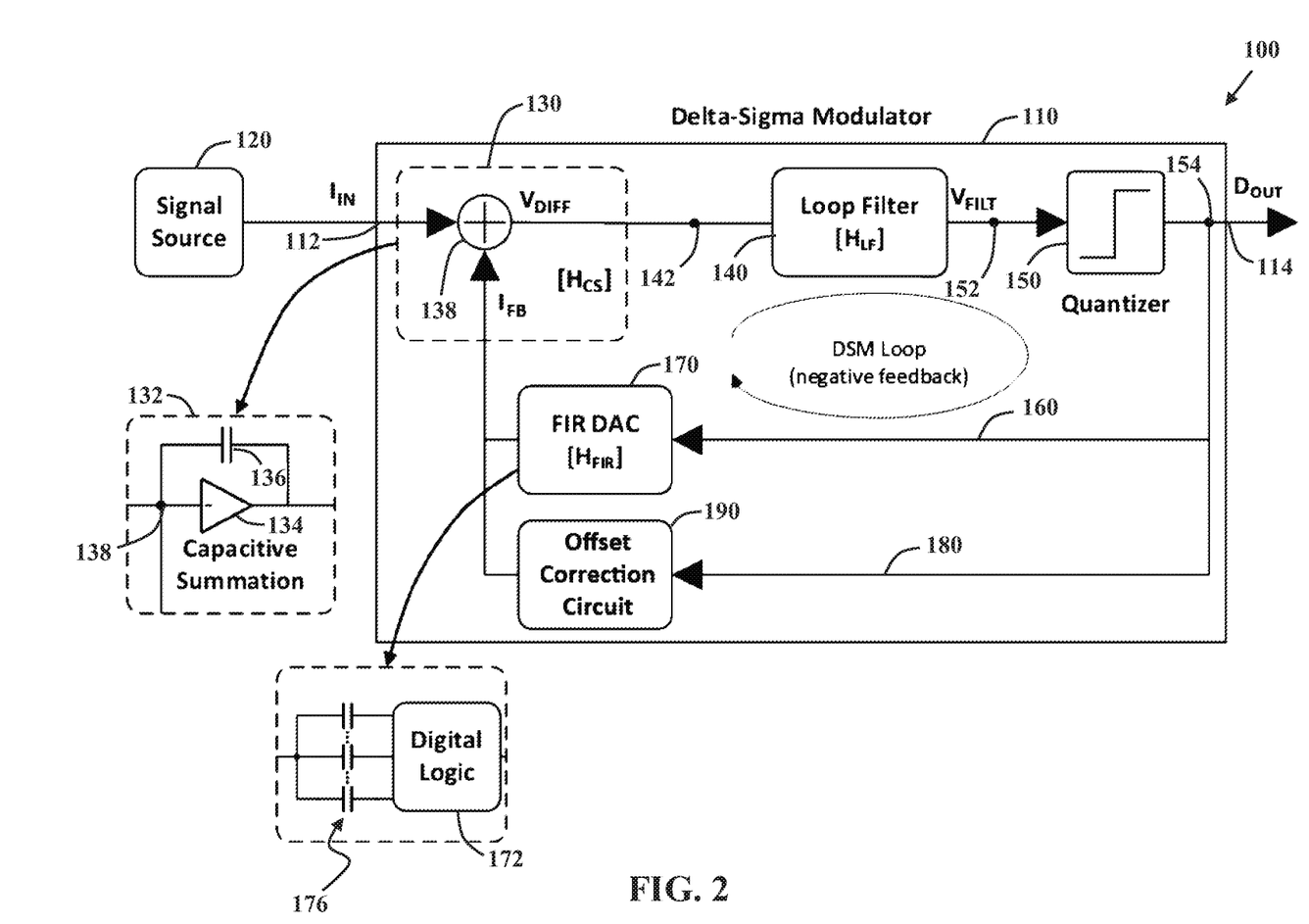
FIG. 2 shows a current sensing system that utilizes a power-efficient architecture for current-to-digital conversion.

FIG. 2 shows a current sensing system 100 that utilizes a power-efficient architecture for current-to-digital conversion. The current sensing system 100 achieves greater than 15-bit resolution and sub-MHz bandwidth with greatly reduced power consumption by advantageously reducing the number of nodes in the system that require a high dynamic range. The reduction of the number of nodes in the system that require a high dynamic range is accomplished by including a capacitive conditioning stage within the primary feedback loop of a delta-sigma modulator (DSM) 110, such that a high dynamic range only needs to be enforced at a single node of the delta-sigma modulator 110. Additionally, the capacitive conditioning stage helps to establish very high input impedance at the input 112 of the delta-sigma modulator 110. In this way, the input 112 of the delta-sigma modulator 110 can be connected directly to a high impedance signal source 120, without the need for a front-end pre-amplifier stage, or the like.

The current sensing system 100 includes the delta-sigma modulator 110, which is configured to receive, at the input 112, an analog current input signal $I_{IN}$ directly from a high impedance signal source 120 and to provide, at an output 114, a digital output signal $D_{OUT}$. The delta-sigma modulator 110 comprises, in a forward path, a summation block 130, a loop filter 140, and a quantizer 150. The delta-sigma modulator 110 comprises negative feedback loop (also referred to herein as the "DSM loop") formed by a primary feedback path 160 having a finite impulse response digital-to-analog converter (FIR DAC) 170. Furthermore, in at least some embodiments, the delta-sigma modulator 110 further includes an offset correction loop formed by a secondary feedback path 180 having an offset correction circuit 190.

The high impedance signal source 120 is a time-varying current signal source having very high impedance, such as a time-varying capacitance, a capacitively coupled time-varying voltage source, or the like. In many embodiments, the high impedance signal source 120 is a high impedance sensor configured to measure some physical quantity or parameter. In some embodiments, the high impedance sensor may comprise a capacitive sensor, such as a microphone, which is biased by a high impedance source, such as a reverse biased diode. In one embodiment, the high impedance signal source 120 has an impedance on the order of, for example, at least a giga-ohm or higher. In this way, the high impedance signal source 120 can be considered similar to an ideal current source (which has theoretically infinite impedance). It will be appreciated that, given a high impedance sensor as a signal source, the current sensing system 100 must have a high input impedance, so as to avoid drawing current (beyond a negligible amount) and, thus, negatively affecting the performance of the high impedance sensor. The current sensing system 100 described herein advantageously achieves a very high input impedance without any front-end signal conditioning circuits between the signal source 120 and the delta-sigma modulator 110. However, although the current sensing system 100 is most advantageously utilized in conjunction with a high impedance current source, the high impedance signal source 120 may alternatively comprise a low impedance signal source without affecting to functionality of the current sensing system 100 and while still achieving improved power efficiency.

The summation block 130 is operably connected to the input 112 to receive the current input signal $I_{IN}$ and to the primary feedback path 160, more particularly to an output of the FIR DAC 170, to receive a negative feedback current signal $I_{FB}$. The summation block 130 comprises a capacitive summation circuit 132 configured to add and/or subtract the current input signal $I_{IN}$ and the negative feedback current signal $I_{FB}$ at a summation node 138. The capacitive summation circuit 132 also serves a signal conditioning function and is configured to amplify a sum or difference of the current input signal $I_{IN}$ and the negative feedback current signal $I_{FB}$, and output a difference signal $V_{DIFF}$ at a first intermediate node 142. The capacitive summation circuit 132, in combination with the input capacitance of the signal source 120 and/or the capacitance of the FIR DAC 170, is configured as a pure gain stage and has a flat or all-pass frequency response/transfer function $H_{CS}$ and is not configured to filter or otherwise shape the frequency content of the output signal. In many embodiments, the capacitive summation circuit 132 is configured to have a gain G that is greater than one (e.g., G=3) but, in some embodiments, the capacitive summation circuit 132 may merely act as a buffer having unity gain. In at least one embodiment, the capacitive summation circuit 132 comprises at least one amplifier 134 having a capacitor 136 connected between its output terminal and its negative input terminal. The negative input terminal of the amplifier 134 is connected to the input 112 and is configured to receive the current input signal $I_{IN}$. The difference signal $V_{DIFF}$ is provided at the output terminal of the amplifier 134.

The loop filter 140 is operably connected to the output of the summation block 130 and/or the first intermediate node 142 and is configured to filter the difference signal $V_{DIFF}$ and provide a filtered signal $V_{FILT}$ at a second intermediate node 152. The loop filter 140 comprises one or more filter stages, which may comprise continuous-time filter stages, discrete time filter stages, and/or hybrid filter stages. In at least one embodiment, the one or more filter stages of the loop filter 140 are noise-shaping filters having a frequency response/transfer function $H_{LF}$ that suppresses higher frequency content of the difference signal $V_{DIFF}$. It will be appreciated that the suppression of higher frequency content helps to reduce quantization noise in the current sensing system 100. In at least some embodiments, one or more of the filter stages comprise integrator circuits, each having an amplifier, a capacitor connected between the output terminal and the inverting input terminal of the amplifier, and a resistor connected to the inverting input terminal.

The quantizer 150 is operably connected to the output of the loop filter 140 and/or the second intermediate node 152 and is configured to quantize and/or digitize the filtered signal $V_{FILT}$ and provide a quantized digital output signal $D_{OUT}$ at an output node 154, which is connected to the output 114. It will be appreciated that a quantized signal is a signal having only a predetermined number of possible values/magnitudes. In at least one embodiment, the quantizer 150 comprises one or more comparators configured to generate a single bit or multi-bit output signal. Particularly, in the case of a single bit output, the quantizer 150 comprises a single comparator configured to output a first voltage/current value (e.g., a logical "high" voltage) in response to the filtered signal $V_{FILT}$ being greater than a threshold value, and output a second voltage/current value (e.g., a logical "low" voltage) in response to the filtered signal $V_{FILT}$ being less than the threshold value. In the case of a multi-bit output, the quantizer 150 comprises a plurality of comparators configured to output a different voltage/current levels based on comparisons of the filtered signal $V_{FILT}$ with a plurality of different threshold values.

The primary feedback path 160 is provided between the output of the quantizer 150 and/or the output node 154 and an input of the summation block 130 and/or the summation node 138. The FIR DAC 170 is provided in the primary feedback path 160 and has an input connected to the output of the quantizer 150 and an output connected to the input of the summation block 130. The FIR DAC 170 is configured to convert the quantized digital output signal $D_{OUT}$ into the analog negative feedback current signal $I_{FB}$. In at least one embodiment, the FIR DAC 170 has a frequency response/transfer function $H_{FIR}$. In at least one embodiment, the FIR DAC 170 comprises digital logic 172 configured to operate one or more switches and/or taps connected to an array of capacitors 176 so as to generate the negative feedback current signal $I_{FB}$. It will be appreciated that the FIR DAC 170 improves the gain factor of the system 200.

The secondary feedback path 180 is also provided between the output of the quantizer 150 and an input of the summation block 130. The offset correction circuit 190 is provided in the secondary feedback path 180 and has an input connected to the output of the quantizer 150 and an output connected to the input of the summation block 130. The offset correction circuit 190 is configured to set the DC bias and/or DC operating point at the input of the summation block 130 and to cancel any offset in the system 100. Particularly, the offset correction circuit 190 is configured to adjust or correct the DC offset present at the inverting input of the amplifier 134, such that it is equal to a desired DC bias point (e.g., zero). In some embodiments, the offset correction circuit 190 includes a proportional-integrator circuit and/or a low pass filter circuit. The offset correction circuit 190 can be implemented using analog, digital, or mixed components.

It will be appreciated that the negative feedback current signal $I_{FB}$ has a similar, but negative form to the current input signal $I_{IN}$. Accordingly, the difference signal $V_{DIFF}$ is quite small in magnitude compared to the current input signal $I_{IN}$ with and the negative feedback current signal $I_{FB}$. Accordingly, the capacitive summation circuit 132 can achieve a relatively large gain G for with a relatively small sized capacitor 136. Furthermore, since the difference signal $V_{DIFF}$ is quite small, high dynamic range requirements do not need to be enforced at the input of the loop filter 140. Thus, the loop filter 140 can be implemented in a more power efficient manner.

Figure 3:
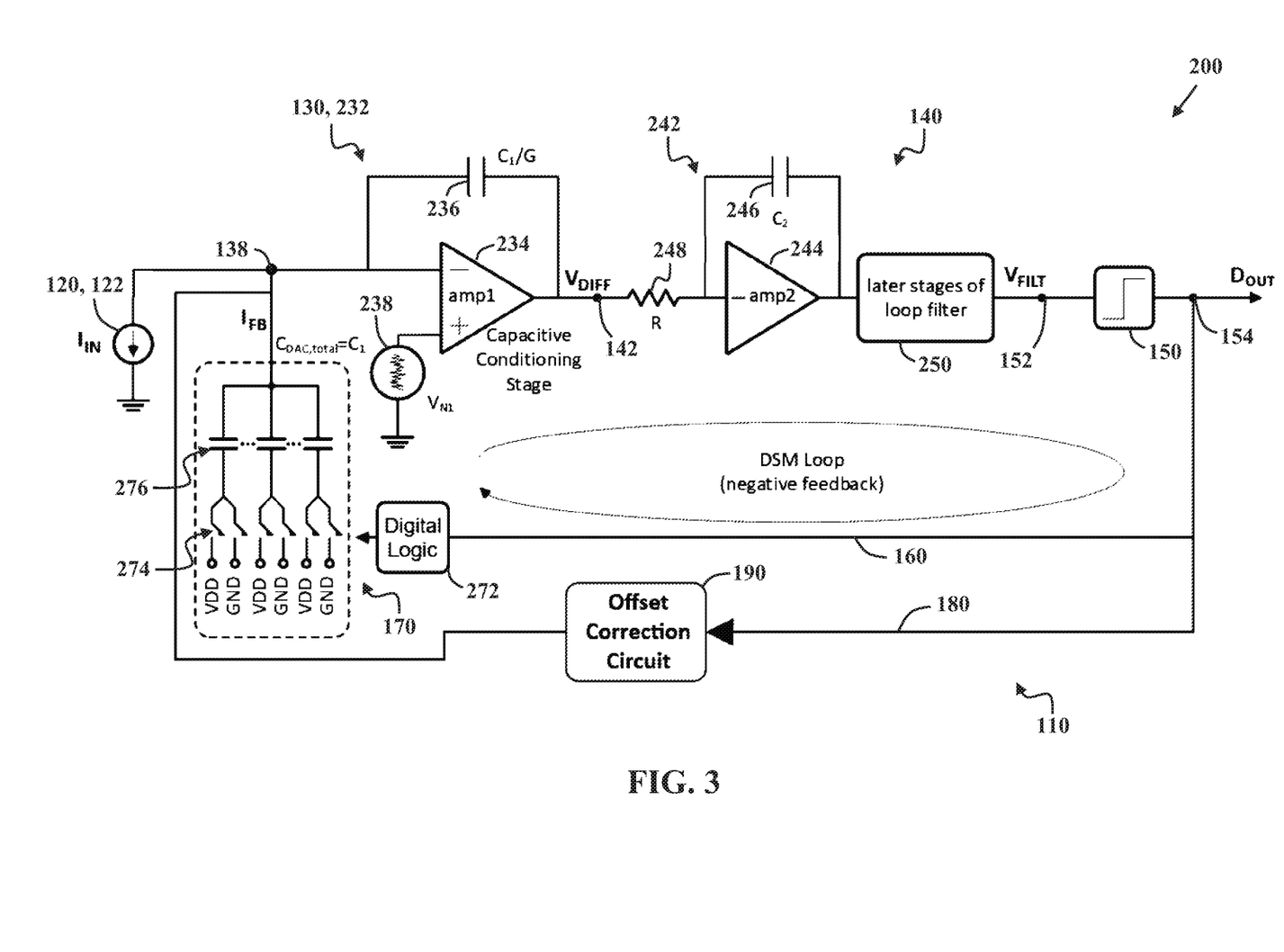
FIG. 3 shows an exemplary realization of the current sensing system of FIG. 2.

FIG. 3 shows a current sensing system 200, which is an exemplary realization of the current sensing system 100. In current sensing system 200, the high impedance signal source 120 is illustrated as an ideal current source 122 coupled directly to the input 112. However, the high impedance signal source 120 can alternatively be illustrated as voltage source that is coupled to the input 112 via a capacitor having a capacitance $C_1$ (not shown).

The summation block 130 is implemented with a capacitive summation circuit 232 formed by an amplifier 234 having a capacitor 236 connected between its output and its inverting input. The capacitor 236 has a capacitance $C_1/G$, where G is the gain of the capacitive summation circuit 232. The noise of the capacitive summation circuit 232 is illustrated as a voltage source 238 having a voltage $V_{n1}$ connected to a non-inverting input of the amplifier 234. The capacitive summation circuit 232 is configured to amplify a sum or difference of the current input signal $I_{IN}$ and the negative feedback current signal $I_{FB}$ and output a difference signal $V_{DIFF}$, as similarly discussed above with respect to the current sensing system 100.

The loop filter 140 includes at least one integrator circuit 242 formed by an amplifier 244 having a capacitor 246 connected between its output and its inverting input and a resistance 248 connected between the input of the amplifier 244 and the output of the amplifier 234 of the capacitive summation circuit 232. The resistance 248 may take the form of a resistor, switched capacitor, or the like. The capacitor 246 has a capacitance $C_2$ and the resistance 248 has a resistance R. In some embodiments, the later stages 250 of the loop filter 140 may include further integrators, which are similarly configured. The integrator 232 and/or the later stages 250 are configured to filter the difference signal $V_{DIFF}$ and provide a filtered signal $V_{FILT}$, as similarly discussed above with respect to the current sensing system 100.

The FIR DAC 170 includes digital logic 272 configured to operate a plurality of switches and/or taps 274 connected to an array of capacitors 276 so as to generate the negative feedback current signal $I_{FB}$. The capacitors 276 have a total capacitance $C_1$. In at least one embodiment, the total capacitance of the capacitors 276 is greater than or equal to the time varying capacitance of the high impedance signal source 120. The digital logic 272 is configured to operate the switches and/or taps 274 to generate the analog negative feedback current signal $I_{FB}$ based on the quantized digital output signal $D_{OUT}$, as similarly discussed above with respect to the current sensing system 100. Particularly, each capacitor 276 has a first terminal connected to the summation node 138 and a second terminal connected to at least one of the switches and/or taps 274. The digital logic 272 is configured to operate the switches and/or taps 274 to selectively connected the second terminal of each capacitor 176 to either a first voltage (e.g., VDD) or a second voltage (e.g., GND). The digital logic 272 may comprise any logic such as delay elements, a processor, a controller, a programmable logic device, one or more logic gates, or the like.

Figure 4:
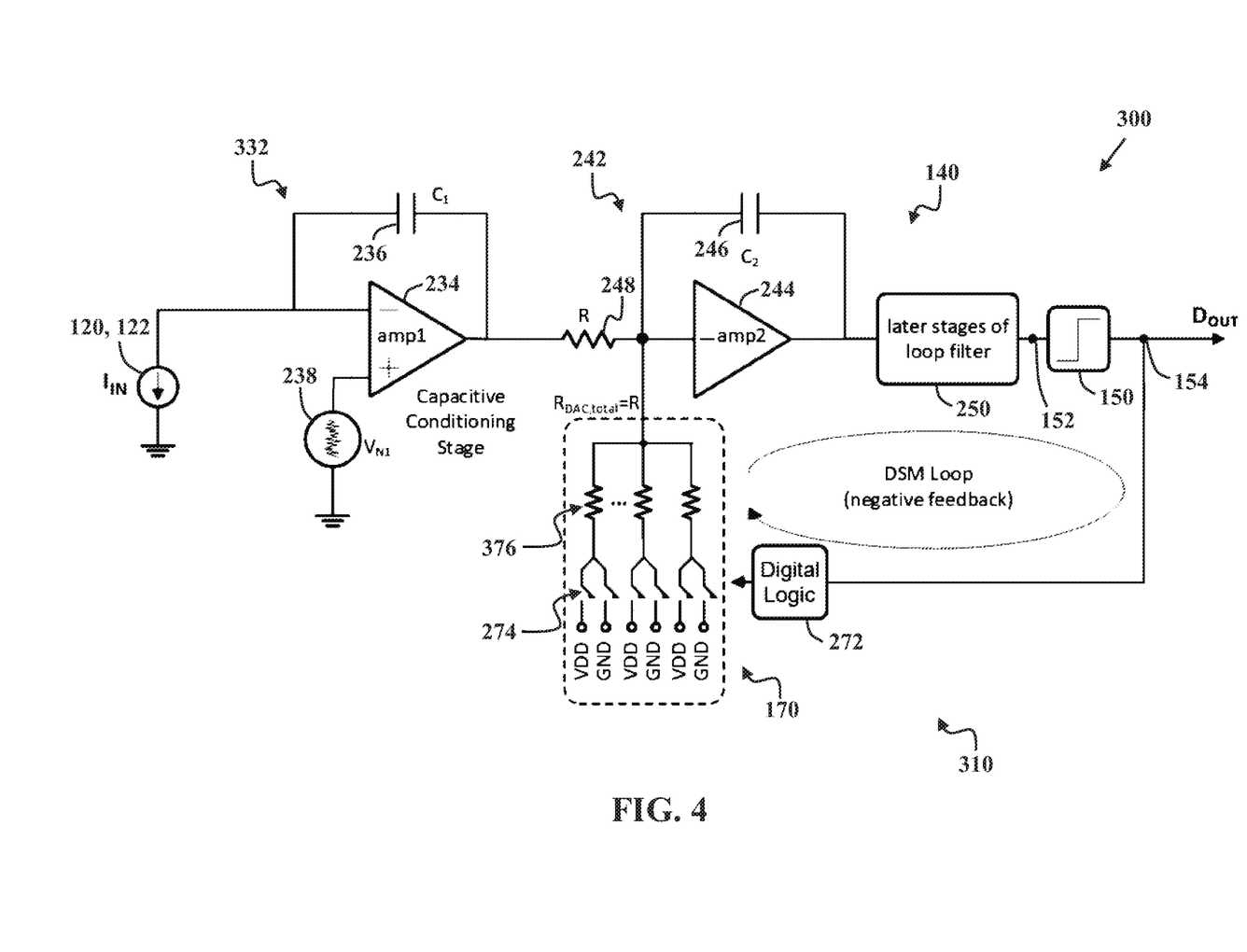
FIG. 4 shows, for comparison, an exemplary alternative current sensing system with a front-end capacitive conditioning stage.

The current sensing system 200 has a significantly reduced input referred noise compared to a similar system in which the capacitive summation circuit 232 is not included within the DSM loop and, rather, a front-end conditioning stage is included between the high impedance signal source 120 and the input 112 of the delta sigma modulator 110. Particularly, for sake of comparison, FIG. 4 shows an exemplary realization of a current sensing system 300, which is similar to the current sensing system 200 except that the capacitive summation circuit 232 is removed from the DSM loop and instead a similar capacitive conditioning circuit 332 is used to couple with the high impedance signal source 120 with input 112 of a delta sigma modulator 310. Additionally, in the current sensing system 300, the array of capacitors 176 are substituted by an array of resistors 376 having a total resistance R. Finally, it will be appreciated that the DC bias point of the system 300 is set by the resistors 248 and 376, rather than an offset correction circuit, as in the system 200. Other elements of the current sensing system 300 that are equivalent to the elements of the current sensing system 200 are labeled with the same reference numbers, and not described again in detail.

In the exemplary current sensing system 300, the capacitive conditioning circuit 332 and the first integrator 242 of the loop filter 140 dominates the system input referred noise. Particularly, input referred noise of the current sensing system 300 is approximately equal to:

$$V_{n1}^2 \|sC_1\|^2 + 8kTR\|sC_1\|^2,$$

where $s=j\omega$, k is the Boltzmann constant, and T is the operating temperature.

Consequently, the amplifiers in the capacitive conditioning circuit 332 and the first integrator 242 need to consume power in order to suppress noise and provide sufficient driving strength for a small resistor, R.

Returning to FIG. 3, to address this issue, the current sensing system 200 advantageously includes the capacitive summation circuit 232 within the DSM loop of the delta sigma modulator 110, which serves the signal conditioning function. By moving the capacitive summation circuit 232 inside the DSM feedback loop, capacitive summation circuit 232 only amplifies the difference between the input current signal $I_{IN}$ and the negative feedback current signal $I_{FB}$, thus enable the usage of a reduced feedback capacitor, $$\frac{C_1}{G},$$

to amplify the signal and attenuate noise from the later stages. Additionally, by utilizing the capacitors 276 in the FIR DAC 170, rather than the resistors 376, a source of noise in the feedback path 160 is eliminated. As a result, input referred noise of the current sensing system 200 is approximately equal to:

$$V_{n1}^2 \left( \frac{\frac{C_1}{G} + C_1}{\frac{C_1}{G}} \right)^2 \left\| \frac{sC_1}{G} \right\|^2 + 4kTR \left\| \frac{sC_1}{G} \right\|^2 =$$

$$V_{n1}^2 \|sC_1\|^2 \left(1 + \frac{1}{G}\right)^2 + 4kTR \left\| \frac{sC_1}{G} \right\|^2.$$

With G>1, the noise penalty of the capacitive signal conditional stage is limited while the noise reduction from succeeding loop filter stages is significant. Thus, for most situations, the current sensing system 200 has greatly improved performance compared to the current sensing system 300. Particularly, the current sensing system 200 has a reduced input referred noise, which enables more a power efficient implementation for given gain, resolution, and bandwidth requirements.

Figure 5:
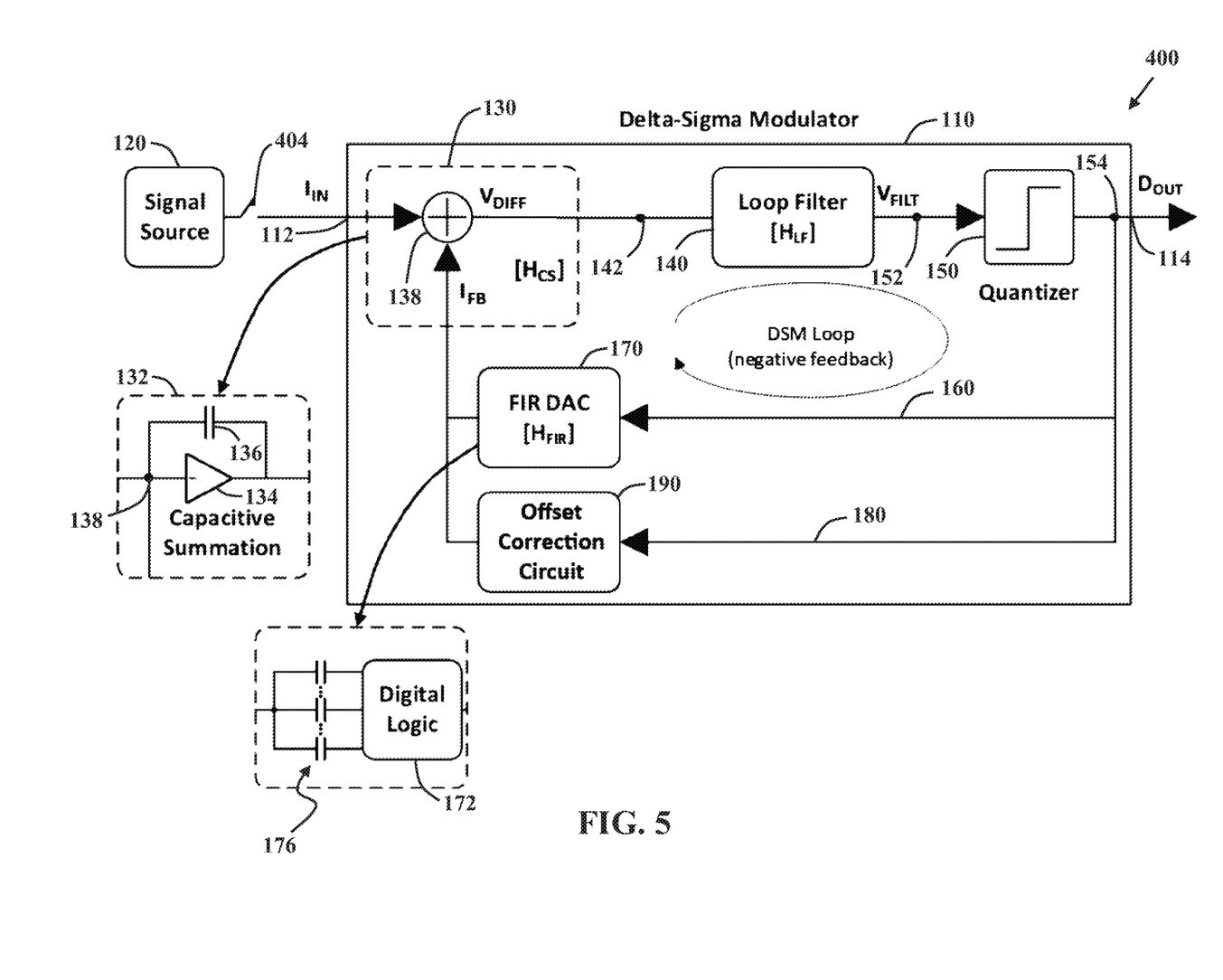
FIG. 5 shows a further current sensing system having a switch configured to selectively to connect the signal source to the delta-sigma modulator.

FIG. 5 shows a further current sensing system 400, which is essentially similar to the current sensing system 200 except that it further includes a switch 404 configured to selectively to connect and disconnect the high impedance signal source 120 to and from the input 112 of the delta-sigma modulator 110 based on a control signal. In at least one embodiment, a processor, controller, or the like (not shown), is configured to operate the switch 404 with a control signal such that the switch 404 is briefly opened while the value of the quantized output signal $D_{OUT}$ at the output node 154 changes values. In this way, changes in the value of the quantized output signal $D_{OUT}$ do not create disturbances in the input current signal $I_{IN}$. In at least one embodiment, the switch 404 is opened a small predetermined amount of time before the end of each clock cycle of the comparators of the quantizer 150 and closed a small predetermined amount of time after the beginning of each clock cycle of the comparators of the quantizer 150. In embodiments in which the high impedance current source 120 is a sensor, this improves the performance of the sensor by not causing such disturbances.

Figure 6:
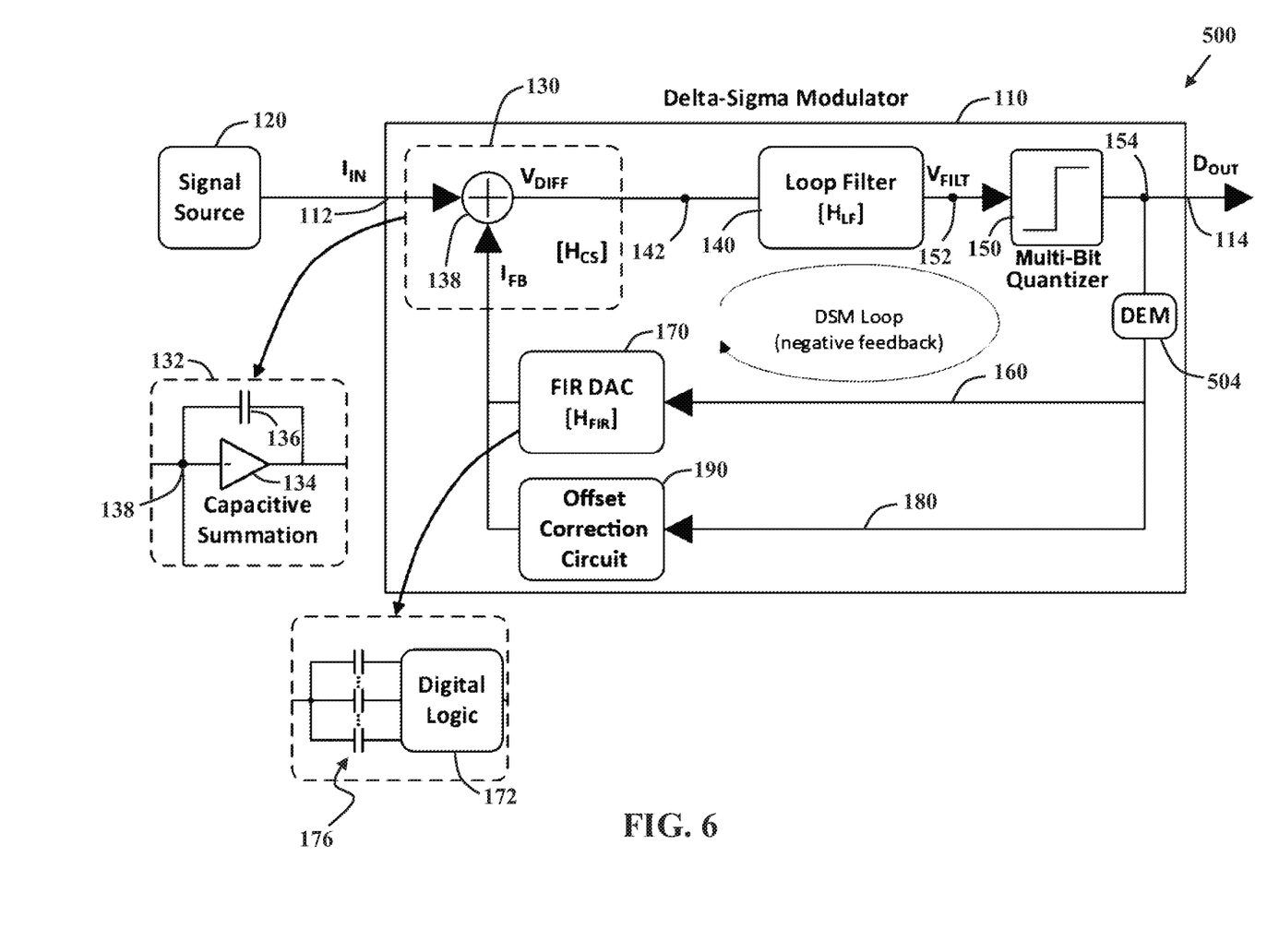
FIG. 6 shows a further current sensing system having a dynamic element matching circuit arranged in at least the primary feedback path in addition to the FIR DAC.

FIG. 6 shows a further current sensing system 500, which is essentially similar to the current sensing system 200 except that it further includes a dynamic element matching (DEM) circuit 504 arranged in at least the primary feedback path 160. In some embodiments, the DEM circuit 504 is arranged in a shared portion of both the primary and secondary feedback paths 160 and 180. Particularly, in embodiments having a multi-bit quantizer 150, the DEM circuit 504 is included. The DEM circuit 504 is configured to mitigate non-linearity in the FIR DAC 170 when used in conjunction with a multi-bit quantizer.

Figure 7:
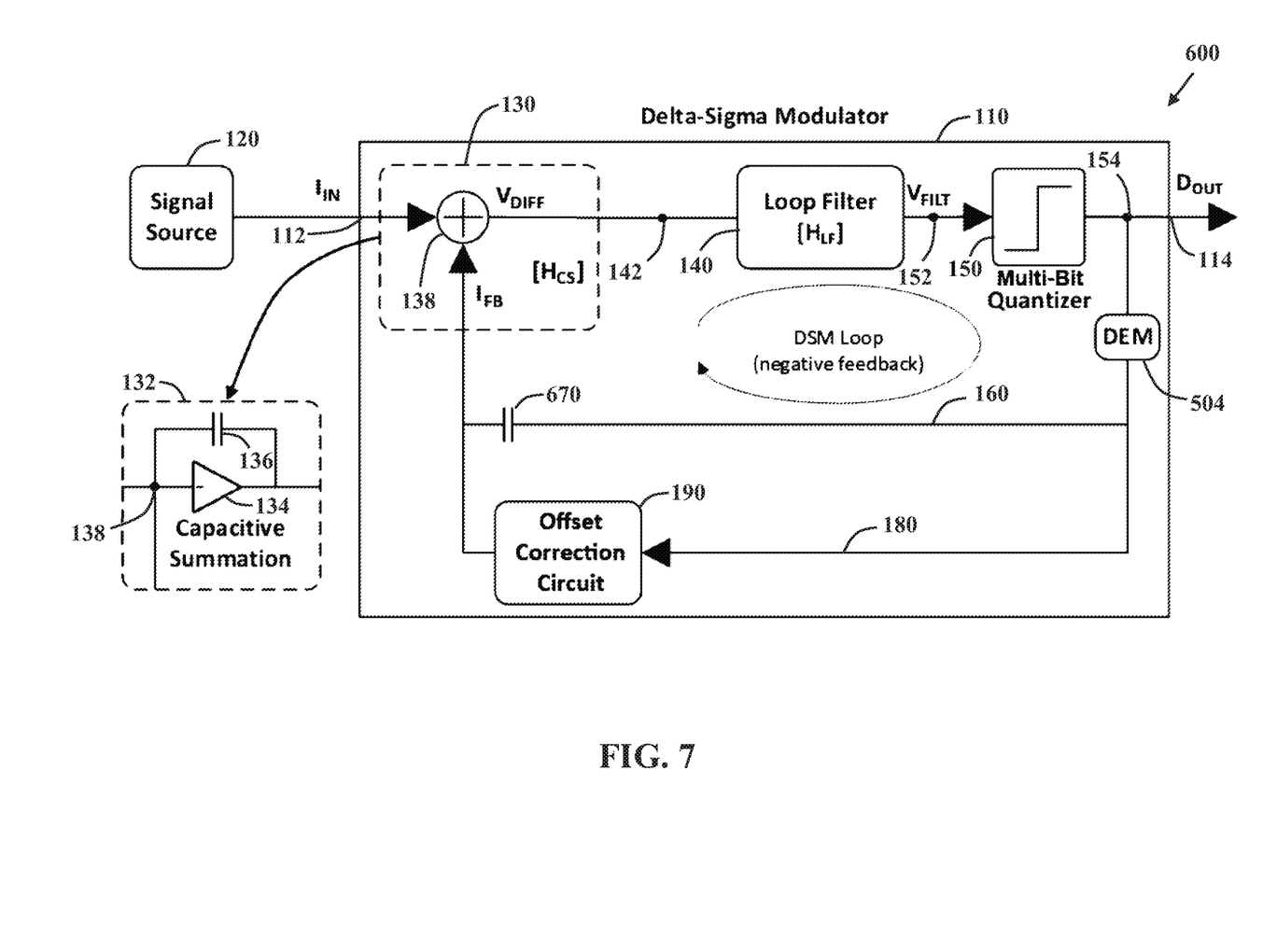
FIG. 7 shows a further current sensing system having a dynamic element matching circuit arranged in at least the primary feedback, without an FIR DAC.

In at least some embodiments, the FIR DAC 170 can be omitted when a multi-bit quantizer 150 and a DEM circuit 504 are utilized. Particularly, FIG. 7 shows a further current sensing system 600, which is essentially similar to the current sensing system 500 except that the FIR DAC 170 is eliminated. Instead, the FIR DAC is replaced by a capacitance 670 configured to capacitively couple the output of the DEM circuit 504 and/or the quantized output signal $D_{OUT}$ to the summation node 138. The capacitance 670 may be one or more capacitors connected in parallel and/or in series. In at least one embodiment, the capacitive summation circuit 132, in combination with the input capacitance of the signal source 120 and the capacitance 670, is configured as a pure gain stage and has a flat or all-pass frequency response/transfer function $H_{CS}$ and is not configured to filter or otherwise shape the frequency content of the output signal, in the same way described above with respect to FIG. 2.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A delta sigma modulator for sensing a current input signal of a current source, the delta sigma modulator comprising:
    a first node configured to connect to the current source and receive the current input signal, the first node being an input of the delta sigma modulator;
    a capacitive summation circuit having an input connected to the first node and an output connected to a second node, the capacitive summation circuit being configured to amplify a signal at the first node and provide an amplified signal to the second node, the capacitive summation circuit comprising (i) a first amplifier having an input connected to the first node and an output connected to the second node and (ii) a first capacitance connected between the output of the first amplifier and the input of the first amplifier;
    a loop filter circuit having an input connected to the second node and an output connected to a third node, the loop filter being configured to filter the amplified signal at the second node and provide a filtered signal to the third node;
    a quantizer circuit having an input connected to the third node and an output connected to a fourth node, the fourth node being an output of the delta sigma modulator, the quantizer circuit being configured to quantize the filtered signal at the third node and provide a quantized signal to the fourth node;
    a first feedback path connected between the fourth node and the first node, at least one second capacitance being arranged in the first feedback path and configured to capacitively couple the quantized signal to the first node; and a second feedback path connected between the fourth node to the first node, the second feedback path including an offset correction circuit arranged in the second feedback path, the offset correction circuit configured to correct a DC offset in the delta sigma modulator by adjusting a DC offset at the first node to have a predetermined DC offset magnitude.

2. The delta sigma modulator of claim 1, the first feedback path comprising:
a finite impulse response digital-to-analog converter arranged in the first negative feedback path, the finite impulse response digital-to-analog converter configured to convert the quantized signal at the fourth node into an analog feedback signal and provide the analog feedback signal to the first node.

3. The delta sigma modulator of claim 2, the finite impulse response digital-to-analog converter comprising:
a plurality of second capacitances, each second capacitance having a first terminal and a second terminal, the first terminal of each second capacitance being connected to the first node;
a plurality of switches configured to selectively connect the second terminal of each second capacitance to a first voltage and a second voltage; and
a processor configured to operate the plurality of switches to provide the analog feedback signal at the first node.

4. The delta sigma modulator of claim 1, wherein the capacitive summation circuit in combination with the at least one second capacitance provides a flat frequency response.

5. The delta sigma modulator of claim 1, the loop filter comprising:
at least one noise shaping filter.

6. The delta sigma modulator of claim 5, the loop filter comprising:
at least one integrator circuit.

7. The delta sigma modulator of claim 6, the at least one integrator circuit comprising:
a second amplifier;
a third capacitance connected between an output of the second amplifier and an input of the second amplifier; and
a resistance connected between the second node and the input of the second amplifier.

8. The delta sigma modulator of claim 1, further comprising:
a switch connected between the current source and the first node; and
at least one processor configured to operate the switch to (i) open a first predetermined amount of time before each change in value of the quantized signal at the fourth node and (ii) close a second predetermined amount of time after each change in value of the quantized signal at the fourth node.

9. The delta sigma modulator of claim 1, wherein:
the quantizer is a multi-bit quantizer; and
the first feedback path comprising a dynamic element matching circuit.

10. The delta sigma modulator of claim 1, wherein the first node is connected directly to the current source.

11. The delta sigma modulator of claim 1, wherein the current source is a time-varying capacitance.

12. The delta sigma modulator of claim 1, wherein the current source is a capacitive sensor.

13. The delta sigma modulator of claim 1, wherein the current source is a time-varying voltage source coupled to the first node via a fourth capacitance.

14. A current sensing system comprising:
a capacitive sensor configured to measure a physical parameter and provide a current input signal that is representative of the physical parameter, the capacitive sensor having an output impedance of at least one giga-ohm; and
a delta sigma modulator comprising:
a first node connected directly to the capacitive sensor and configured to receive the current input signal, the first node being an input of the delta sigma modulator;
a capacitive summation circuit having an input connected to the first node and an output connected to a second node, the capacitive summation circuit being configured to amplify a signal at the first node and provide an amplified signal to the second node, the capacitive summation circuit comprising (i) a first amplifier having an input connected to the first node and an output connected to the second node and (ii) a first capacitance connected between the output of the first amplifier and the input of the first amplifier;
a loop filter circuit having an input connected to the second node and an output connected to a third node, the loop filter being configured to filter the amplified signal at the second node and provide a filtered signal to the third node;
a quantizer circuit having an input connected to the third node and an output connected to a fourth node, the fourth node being an output of the delta sigma modulator, the quantizer circuit being configured to quantize the filtered signal at the third node and provide a quantized signal to the fourth node; and
a first feedback path connected between the fourth node and the first node, at least one second capacitance being arranged in the first feedback path and configured to capacitively couple the quantized signal to the first node.

15. The current sensing system of claim 14, the first feedback path comprising:
a finite impulse response digital-to-analog converter arranged in the first negative feedback path, the finite impulse response digital-to-analog converter configured to convert the quantized signal at the fourth node into an analog feedback signal and provide the analog feedback signal to the first node.

16. The current sensing system of claim 15, the finite impulse response digital-to-analog converter comprising:
a plurality of second capacitances, each second capacitance having a first terminal and a second terminal, the first terminal of each second capacitance being connected to the first node;
a plurality of switches configured to selectively connect the second terminal of each second capacitance to a first voltage and a second voltage; and
a processor configured to operate the plurality of switches to provide the analog feedback signal at the first node.

17. The current sensing system of claim 14, the delta sigma modulator further comprising:
a second feedback path connected between the fourth node to the first node, the second feedback path comprising:
an offset correction circuit arranged in the second feedback path, the offset correction circuit configured to correct a DC offset in the delta sigma modulator by adjusting a DC offset at the first node to have a predetermined DC offset magnitude.

18. The current sensing system of claim 14, wherein the capacitive summation circuit in combination with the at least one second capacitance provides a flat frequency response.

19. A delta sigma modulator for sensing a current input signal of a current source, the delta sigma modulator comprising:
a first node configured to connect to the current source and receive the current input signal, the first node being an input of the delta sigma modulator;
a capacitive summation circuit having an input connected to the first node and an output connected to a second node, the capacitive summation circuit being configured to amplify a signal at the first node and provide an amplified signal to the second node, the capacitive summation circuit comprising (i) a first amplifier having an input connected to the first node and an output connected to the second node and (ii) a first capacitance connected between the output of the first amplifier and the input of the first amplifier;
a loop filter circuit having an input connected to the second node and an output connected to a third node, the loop filter being configured to filter the amplified signal at the second node and provide a filtered signal to the third node;
a quantizer circuit having an input connected to the third node and an output connected to a fourth node, the fourth node being an output of the delta sigma modulator, the quantizer circuit being configured to quantize the filtered signal at the third node and provide a quantized signal to the fourth node;
a first feedback path connected between the fourth node and the first node, at least one second capacitance being arranged in the first feedback path and configured to capacitively couple the quantized signal to the first node;
a switch connected between the current source and the first node; and
at least one processor configured to operate the switch to (i) open a first predetermined amount of time before each change in value of the quantized signal at the fourth node and (ii) close a second predetermined amount of time after each change in value of the quantized signal at the fourth node.

* * * * *